United States Patent
Yen et al.

(10) Patent No.: US 8,866,185 B2
(45) Date of Patent: Oct. 21, 2014

(54) WHITE LIGHT LED WITH MULTIPLE ENCAPSULATION LAYERS

(75) Inventors: Jui-Kang Yen, Taipei (TW); Yung-Wei Chen, Taichung (TW); Tien-Min Liu, Fengyuan (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 1842 days.

(21) Appl. No.: 11/851,216

(22) Filed: Sep. 6, 2007

(65) Prior Publication Data
US 2009/0065791 A1 Mar. 12, 2009

(51) Int. Cl.
*H01L 33/00* (2010.01)
*H01L 33/50* (2010.01)

(52) U.S. Cl.
CPC .................................. *H01L 33/507* (2013.01)
USPC .................. 257/100; 257/79; 257/98; 257/99

(58) Field of Classification Search
USPC .............................................. 257/79, 98–100
See application file for complete search history.

(56) References Cited

U.S. PATENT DOCUMENTS

| 5,959,316 | A | * | 9/1999 | Lowery | 257/98 |
| 5,998,925 | A | | 12/1999 | Shimizu et al. | |
| 7,501,656 | B2 | * | 3/2009 | Han et al. | 257/79 |
| 7,517,728 | B2 | * | 4/2009 | Leung et al. | 438/122 |
| 7,646,035 | B2 | * | 1/2010 | Loh et al. | 257/99 |
| 2003/0201451 | A1 | * | 10/2003 | Suehiro et al. | 257/98 |
| 2005/0221519 | A1 | | 10/2005 | Leung et al. | |

* cited by examiner

*Primary Examiner* — Ori Nadav
(74) *Attorney, Agent, or Firm* — Stephen A. Gratton

(57) ABSTRACT

Light-emitting semiconductor devices with multiple encapsulation layers having more uniform white light when compared to conventional light-emitting devices and methods for producing the same are provided. The uniformity of the emitted white light may be quantified by comparing correlated color temperature (CCT) variations between devices, where embodiments of the present invention have a lower CCT variation when compared to conventional devices over a substantial range of light emission angles.

19 Claims, 16 Drawing Sheets

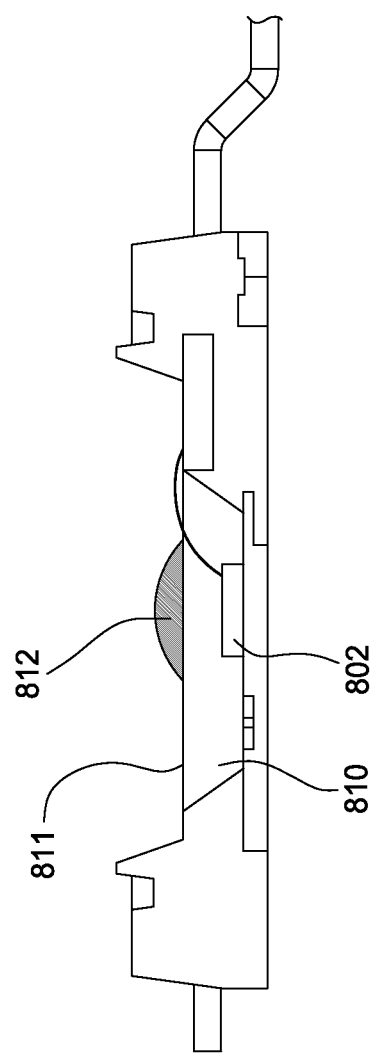

WHITE LIGHT LED WITH MULTIPLE ENCAPSULATION LAYERS

BACKGROUND OF THE INVENTION

1. Field of the Invention

Embodiments of the present invention generally relate to light-emitting semiconductor devices and, more particularly, to packaging such devices with multiple encapsulation layers in an effort to produce uniform white light.

2. Description of the Related Art

Many techniques exist to emit white light from semiconductor devices, such as light-emitting diodes (LEDs). Some of these include combining the outputs of individual red, green, and blue LEDs; combining a blue LED with yellow phosphor or green and red phosphor; and combining an ultraviolet LED with red, green, and blue phosphor. The simplest technique, or at least the one with the least elements, involves employing a blue LED combined with a layer or coating of yellow phosphor, as disclosed in U.S. Pat. No. 5,998,925, entitled "Light Emitting Device Having a Nitride Compound Semiconductor and a Phosphor Containing a Garnet Fluorescent Material," and illustrated in FIG. 1.

FIG. 1 depicts a lead-type light-emitting diode (LED) 100 where the light-emitting component 102 is installed on a mount lead 104. An n-electrode and a p-electrode of the light-emitting component 102 are connected to the mount lead 104 and a second lead 106, respectively, via wires 108. A cup of the mount lead 104 is filled with a coating resin 110 that contains a specified phosphor to cover the light-emitting component 102. The leads 104,106, light-emitting component 102, and the coating resin 110 are encased in a molding material 112, which protects the light-emitting component 102 and may function as a lens to focus or diffuse the light emitted by the LED 100. When the LED is forward biased, light emitted by the light-emitting component 102 excites the phosphor contained in the coating resin 110 to generate fluorescent light having a wavelength different from that of the light-emitting component's light, so that the fluorescent light emitted by the phosphor and the light-emitting component's light that is output without contributing to the excitation of the phosphor are mixed and output. Thus, when the light-emitting component 102 employs a gallium nitride (GaN) compound semiconductor and the coating resin 110 includes a garnet phosphor activated with cerium, blue light is emitted from the light-emitting component 102, and some of the light excites the phosphor to produce yellow light. The blended combination of blue and yellow light essentially produces white light.

However, the white light produced by conventional light-emitting semiconductor devices employing a blue LED and a yellow phosphor exhibits a color ring phenomenon, where the periphery of the emitted light appears more yellow and the middle appears bluer. Referring now to FIG. 2, the optical spectrum 200 is not uniform and does not have the broadband characteristic of true white light. One can easily discern the sharp peak 202 at a wavelength of approximately 450 nm arising from the blue light-emitting component 102 and the less intense, broader bandwidth yellow component 204 having a center wavelength of approximately 565 nm from the excited phosphor in the coating resin 110. When the blue light excites the phosphor at different angles, the white light spectrum changes due to the blue light intensity (which is proportional to the cosine of the emission angle), the phosphor concentration, and the phosphor thickness, thus yielding the color ring.

To measure the uniformity of the emitted white light, the variation in the correlated color temperature (CCT) may be used. The color temperature of a light source is determined by comparing its hue with a theoretical, heated blackbody radiator. The Kelvin temperature at which the heated blackbody radiator matches the hue of the light source is that source's color temperature. An incandescent light is very close to being a blackbody radiator, but many other light sources, such as fluorescent lamps, do not emit radiation in the form of a blackbody curve and are therefore assigned what is known as a correlated color temperature (CCT). The CCT is the color temperature of a blackbody which most closely matches the light source's perceived color. The higher the Kelvin rating, the "cooler" or more blue the light. The lower the rating, the "warmer" or more yellow the light.

By measuring the CCT at different light emission angles and comparing this variation among different white-light-emitting devices, the uniformity of the white light produced can be quantified. A blue LED with a coating resin of yellow phosphor, such as the LED 100 of FIG. 1, may have a typical CCT graph 300 as shown in FIG. 3 where the CCT curve 302 varies from approximately 5800 K to 7200 K across a 140° (±70° from the center light-emitting axis of the LED) range of light emission angles. Because of the color ring, the CCT is higher in the center than in the periphery, where the light tends to be more yellow.

To reduce the color variation and improve the uniformity of the emitted white light, manufacturers have tried packaging the light-emitting diode die (LED chip) in various combinations of encapsulation materials, such as those disclosed in U.S. Published Patent Application No. 2005/0221519, entitled "Semiconductor Light Emitting Devices Including a Luminescent Conversion Element and Methods for Packaging the Same," filed Feb. 10, 2005. FIG. 4 illustrates one such packaged light-emitting diode (LED) device 400, where a light-emitting device 402 is coupled to a substrate 404 and disposed in the cavity of a reflector cup 406. A first encapsulant material 408 is dispensed above the light-emitting device 402 and cured, for example, by heating. A second encapsulant material 410 including a luminescent wavelength conversion material, such as a phosphor, is dispensed into the cavity above the first encapsulant material 408. Having a biconvex, plano-convex, or concavo-convex shape, the second encapsulant material 410 is shown completely covering the first encapsulant material 408. A third encapsulant material 412 having no or a low concentration of luminescent material is dispensed above the second encapsulant material 410, and a lens 414 is disposed in the third encapsulant material 412 before curing.

The resulting CCT polar plot 500 for a semiconductor light-emitting device with a luminescence conversion element, such as the packaged LED device 400 of FIG. 4, is illustrated in FIG. 5. The CCT curve 502 illustrates that near the central light-emitting axis (corresponding to a light emission angle of 0°), the CCT is over 7000 K. Around 45° and 67.5°, the CCT is close to (and in some cases, less than) 6000 K leading to a variation of around 1000 K for a 140° (±70° from the center light-emitting axis) range of light emission angles. A CCT variation of 1000 K may not be considered as very uniform white light by those skilled in the art.

Accordingly, what are needed are methods and apparatus to reduce the color variation (i.e., increase the uniformity) in white light emitted from semiconductor devices.

SUMMARY OF THE INVENTION

Embodiments of the present invention generally provide light-emitting semiconductor devices with multiple encapsulation layers in an effort to produce a more uniform white light when compared to conventional light-emitting devices.

One embodiment of the present invention provides a packaged light-emitting semiconductor device. The packaged device generally includes a housing having a recessed volume; one or more light-emitting semiconductor dies disposed in the recessed volume; a first encapsulation material disposed above the one or more light-emitting semiconductor dies; a second encapsulation material disposed above the first encapsulation material such that only a portion of an upper surface of the first encapsulation material is covered by the second encapsulation material; and a third encapsulation material disposed above the first and second encapsulation materials.

Another embodiment of the present invention provides a packaged light-emitting semiconductor device. The packaged device generally includes a housing having a recessed volume; one or more light-emitting semiconductor dies disposed in the recessed volume; a first encapsulation material disposed above the one or more light-emitting semiconductor dies; a second encapsulation material disposed above the first encapsulation material; and a third encapsulation material disposed above the second encapsulation material such that a total correlated color temperature (CCT) variation of the packaged device is less than about 200 K over a 140° (±70° from a nominal axis) range of light emission angles.

Yet another embodiment of the present invention is a method for packaging a light-emitting semiconductor device. The method generally includes providing one or more light-emitting semiconductor dies disposed in a recessed volume of a housing; partially filling the recessed volume with a first encapsulation material; disposing a second encapsulation material above the first encapsulation material such that only a portion of an upper surface of the first encapsulation material is covered by the second encapsulation material; and at least partially filling the recessed volume with a third encapsulation material above the first and second encapsulation materials.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 14 is a schematic sectional view of a white light-emitting semiconductor device with multiple encapsulation layers where the upper surface of the second encapsulation layer is convex according to an embodiment of the invention

DETAILED DESCRIPTION

Embodiments of the present invention provide light-emitting semiconductor devices with multiple encapsulation layers in an effort to produce a more uniform white light when compared to conventional light-emitting devices. The uniformity of the emitted white light may be quantified by comparing correlated color temperature (CCT) variations between devices, where embodiments of the present invention have a lower CCT variation when compared to conventional devices over a substantial range of light emission angles.

Phosphor Layer Properties

Figure 6:
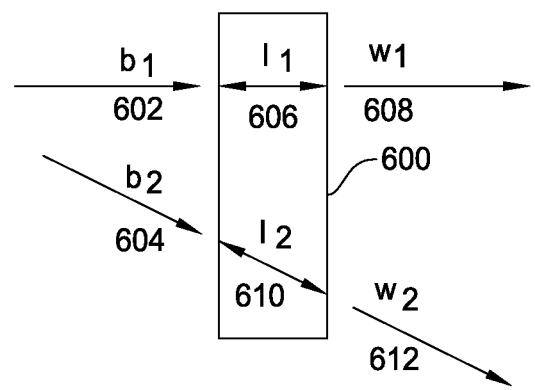
FIG. 6 illustrates the principle of different wavelengths being emitted from incident light of the same wavelength being passed through a phosphor layer at different angles according to embodiments of the invention.

Before delving into a detailed description of light-emitting semiconductor devices in accordance with embodiments of the invention, some properties of light passing through a phosphor layer will be explained. FIG. 6 illustrates a phosphor layer 600 having a uniform phosphor concentration and a uniform thickness with two blue lights $b_1$ 602 and $b_2$ 604 of the same intensity incident upon one side. Incident blue light $b_1$ 602 passes through length $l_1$ 606 of the phosphor layer 600 and is converted to white light $w_1$ 608. Incident blue light $b_2$ 604 enters the phosphor layer 600 at an angle and passes through length $l_2$ 610, which is longer than length $l_1$ 606. Therefore, more blue light is converted to a longer wavelength along length $l_2$ 610, and the correlated color temperature (CCT) of the exiting white light $w_2$ 612 is lower than the CCT of white light $w_1$ 608. Thus, it may be stated that a thicker phosphor layer generally creates a lower CCT for a given incident intensity and phosphor concentration.

Figure 7:
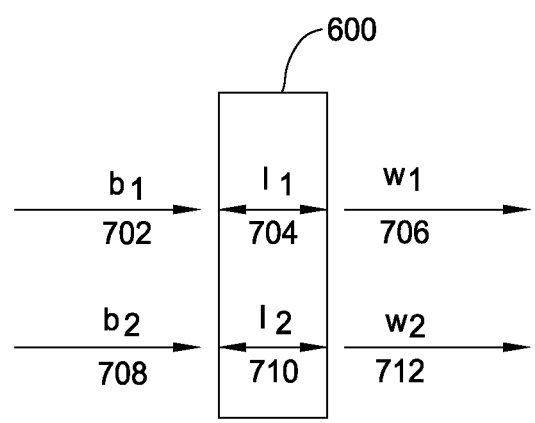
FIG. 7 illustrates the principle of light of different intensities and the same wavelength being passed through a phosphor layer to yield different CCTs according to embodiments of the invention.

Referring now to FIG. 7, the same phosphor layer 600 having a uniform phosphor concentration and a uniform thickness is illustrated. Incident blue light $b_1$ 702 passes through length $l_1$ 704 of the phosphor layer 600 and is converted to white light $w_1$ 706 with a certain intensity $I_1$. Incident blue light $b_2$ 708, which has a higher intensity than blue light $b_1$ 702, traverses length $l_2$ 710 (equal to length $l_1$ 704) and is converted to white light $w_2$ 712 with an intensity $I_2$ greater than $I_1$. Consequently, the CCT of the exiting white light $w_2$ 712 is greater than the CCT of white light $w_1$ 706. Accordingly, it may be stated that higher intensity incident light leads to a higher CCT for a given phosphor concentration and thickness.

Those skilled in the art may also recognize that for a given incident intensity and phosphor layer thickness, a higher phosphor concentration generally results in a lower CCT.

An Exemplary Light-Emitting Device

Figure 8A:
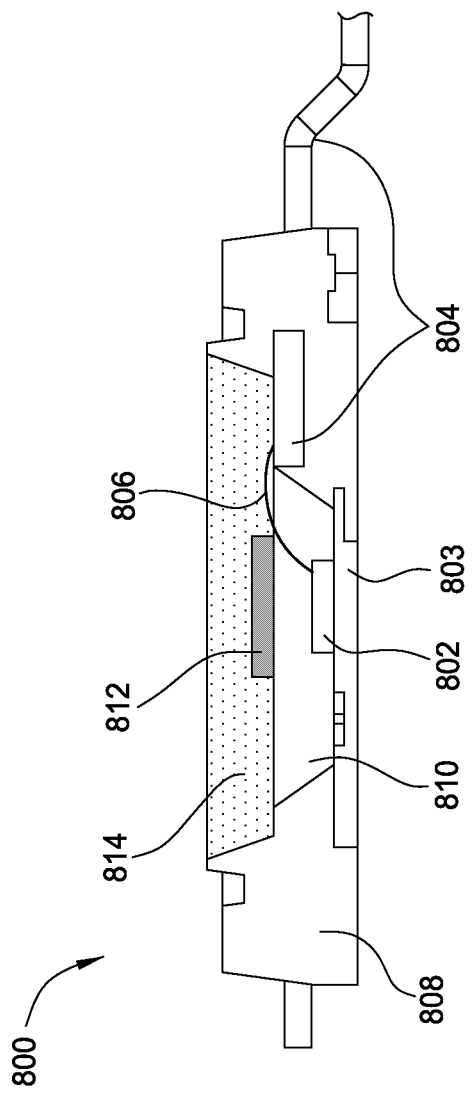
FIGS. 8A-B are schematic sectional views of white light-emitting semiconductor devices with multiple encapsulation layers having a vertical light-emitting diode (VLED) die or an LED die, respectively, according to embodiments of the invention.

FIG. 8A depicts a light-emitting semiconductor device 800 exhibiting substantially uniform white light illumination according to an embodiment of the invention. To produce white light, one or more semiconductor dies 802 emitting light in wavelengths ranging from about 485 nm down to less than 200 nm (i.e., blue to far ultraviolet) may be employed. Such semiconductor dies 802 may include light-emitting diode (LED) dies or laser diode dies, for example, and may be compound semiconductor dies composed of group III-group V combinations of elements, such as gallium nitride (GaN), aluminum nitride (AlN), indium nitride (InN), aluminum gallium nitride (AlGaN), and indium gallium nitride (InGaN). The semiconductor dies 802 may comprise an active layer interposed between a p-doped layer and an n-doped layer such that the active layer emits light when the p-n junction is forward biased.

The semiconductor dies 802 may be coupled to a lead frame 803, 804 for external connection via any suitable technique for electrical conductivity, such as soldering, bonding, or wiring with one or more bond wires 806. For some embodiments as shown in FIG. 8A, a p-doped side of a vertical light-emitting diode (VLED) die may be soldered to the lead frame portion 803, and an n-doped side may be coupled to the lead frame portion 804 via a bond wire 806. During fabrication of the VLED die, one or more metal layers of a thermally and electrically conductive metal substrate may be deposited adjacent to the p-doped side. The metal substrate may be deposited by any suitable technique or combination of techniques, such as electrochemical deposition (ECD) or electroless chemical deposition (ElessCD). The thickness of the metal substrate may be around 400 μm for some embodiments. The metal substrate may be soldered to the lead frame portion 803 providing electrical conduction to the p-doped side and substantial thermal dissipation away from the p-n junction of the VLED die.

Figure 8B:
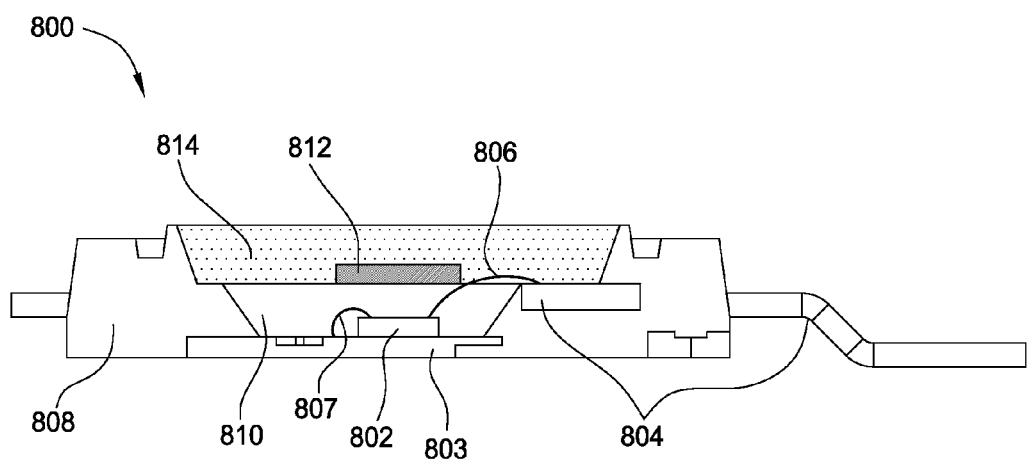
Figure 8C:
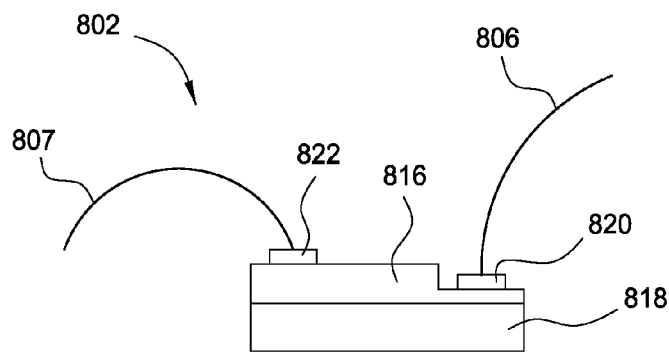
FIG. 8C is an enlarged schematic sectional view of the LED die and bond wires in FIG. 8B according to an embodiment of the invention.

For other embodiments as depicted in FIG. 8B, an LED die may be bonded to the lead frame portion 803 and the p- and n-doped layers of the multilayer epitaxial structure 816 may be electrical coupled to the lead frame 803, 804 via two bond wires 806, 807. Shown with more detail in FIG. 8C, this type of light-emitting semiconductor die 802 may be formed on an insulative or semiconductive growth substrate 818 of such materials as sapphire or silicon carbide (SiC). The bottom surface of the growth substrate 818 may be bonded to the lead frame portion 803 using any suitable material. The actual electrical connection from the lead frame 804 to the n-electrode 820 and p-electrode 822 for the n-doped layer(s) and p-doped layer(s), respectively, may be accomplished via two bond wires 806, 807, both coupled to the same side of the LED die.

The lead frame 803, 804 may comprise nickel-, gold-, or silver-plated copper, and the bond wires 806 may be composed of gold (Au). The lead frame 803, 804 may be encased in a housing 808, which may consist of any suitable insulative material, such as plastic, resin, or ceramic. By exposing a substantial portion of the lead frame 803 through the bottom of the housing and by disposing the dies 806 directly above the exposed portion, the device 800 may permit increased thermal dissipation away from the p-n junction when compared to conventional devices where the lead frame is not exposed.

The housing 808 may have a cavity or recessed volume in which the one or more light-emitting semiconductor dies 802 are disposed. The sides of the cavity may be sloped, such that the cavity is shaped as an inverted cone or pyramid. For some embodiments, the sides of the cavity may be coated with a reflective material in an effort to enhance the light extraction from the device 800.

A first encapsulation material 810 may be disposed within the cavity of the housing 808 and may cover the one or more semiconductor dies 802. The first encapsulation material 810 may be transparent and may comprise a resin, such as epoxy or silicone. For some embodiments, the first encapsulation material 810 may contain little or no wavelength-converting material. Also for some embodiments, the first encapsulation material 810 may contain a diffuser in an effort to evenly spread out the light emitted from the one or more semiconductor dies 802. The diffuser may comprise any suitable material or combination of materials for scattering light, such as $SiO_2$, $Al_2O_3$, $TiO_2$, or $Ta_2O_5$. The diffuser may be suspended in the resin or other material of the first encapsulation material 810.

Figure 9:
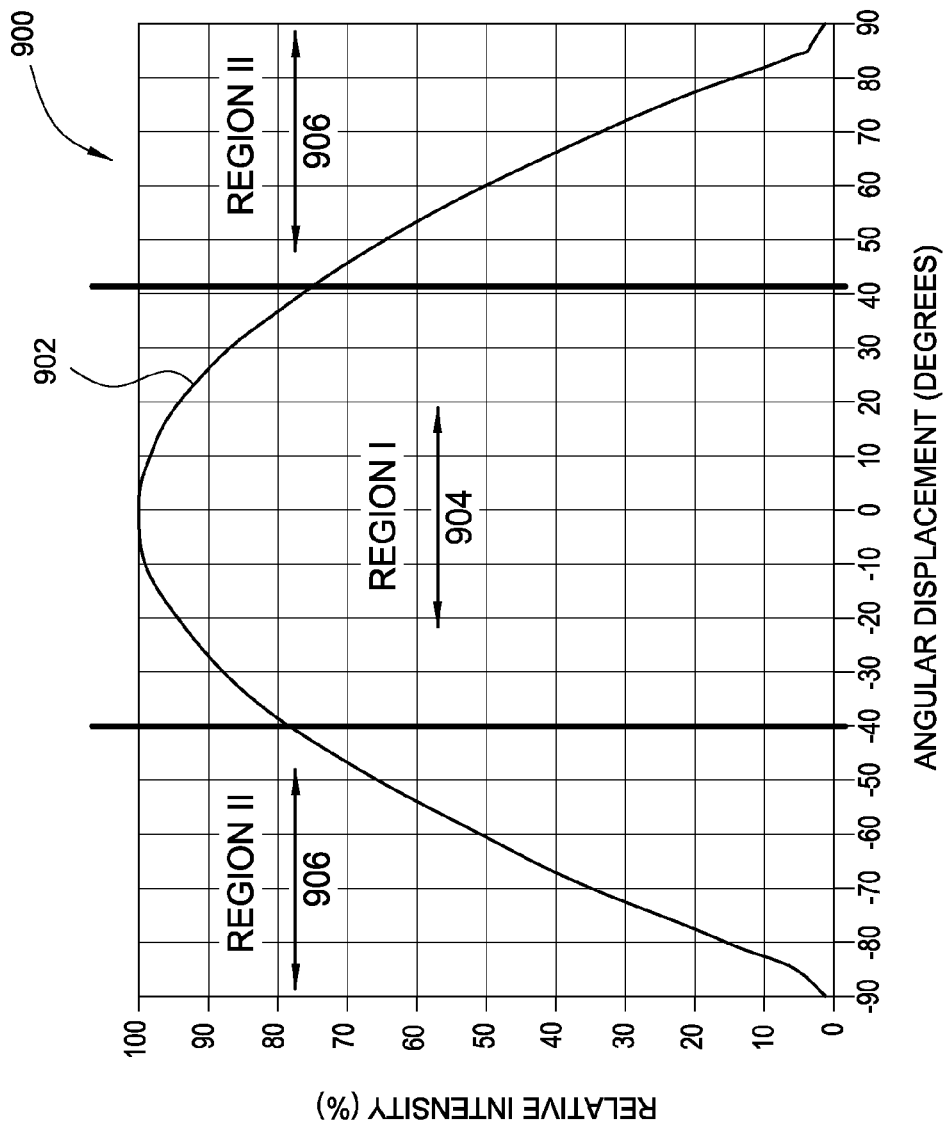
FIG. 9 illustrates breaking up a graph of relative intensity versus angular displacement for a light-emitting semiconductor device into two different regions according to an embodiment of the invention.

A second encapsulation material 812 may be disposed above the first encapsulation material 810 and may only cover a portion of the upper surface of the first encapsulation material 810. The reason for this may be explained by referring to the graph 900 of relative intensity (in %) versus angular displacement (in degrees from a center axis of a typical blue LED) of FIG. 9. The curve 902 depicted is a typical lambertian function where the radiant intensity is directly proportional to the cosine of the angle between an observer's line of sight and the surface normal. The graph 900 may be divided into a high intensity region (region I) 904 and a low intensity region (region II) 906. The dividing line between the two regions 904, 906 may be selected as a relative intensity of around 75%, which corresponds to an angular displacement of approximately ±40° from the center axis.

Figure 10:
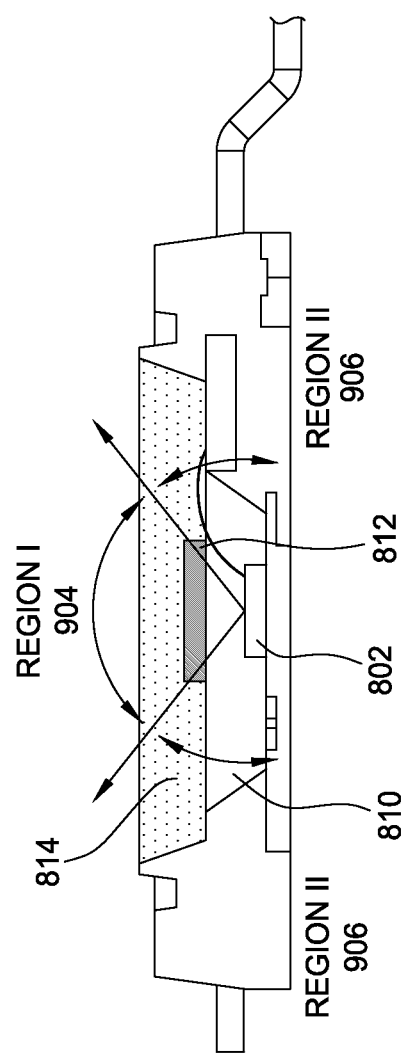
FIG. 10 illustrates the regions of FIG. 9 on the sectional view of FIG. 8A according to an embodiment of the invention.

In an effort to produce a light-emitting semiconductor device capable of emitting uniform white light, the CCT may be lowered in region I 904. Theoretically as an alternative or additional means to adjust the color variation of the emitted white light, the CCT in region II 906 could be increased with respect to region I 904. From the discussion above, the CCT in region I 904 may be lowered in comparison to region II 906 by increasing the phosphor concentration and/or phosphor thickness in region I 904 over the phosphor concentration and/or thickness in region II 906. FIG. 10 illustrates increasing the phosphor concentration of region I 904 compared to region II 906 by using a material with higher phosphor concentration (the second encapsulation material 812) in region I 904 and not in region II 906. Because region I 904 corresponds to a certain angular displacement range based on the selected relative intensity cut-off for high intensity, the second encapsulation material 812 may only cover a portion of the upper surface of the first encapsulation material 810 as shown.

Therefore, the second encapsulation material 812 may comprise a resin and a fluorescent material or combination of materials suitable for converting blue or ultraviolet light to white light, such as YAG/Gd:Ce, TAG:Ce, silicate:Eu, calcium scandate:Ce, or calcium aluminum silicon nitride:Ce. The weight ratio of fluorescent materials to resin may be higher than 10% and, preferably, higher than 20% in the second encapsulation material 812.

A third encapsulation material 814 may be disposed in the recessed volume of the housing 808 and may at least partially, if not completely, fill a remaining portion of the cavity. Thus, the third encapsulation material 814 may cover the second encapsulation material 812 and any uncovered portion of the first encapsulation material 810 (i.e., any portion not covered by the second encapsulation material 812). For other embodiments, the third encapsulation material 814 may only cover the uncovered portion of the first encapsulation material 810 and may not cover the upper surface of the second encapsulation material 812.

Like the second encapsulation material 812, the third encapsulation material 814 may also comprise a resin and a fluorescent material or combination of materials suitable for converting blue or ultraviolet light to white light, such as YAG/Gd:Ce, TAG:Ce, silicate:Eu, calcium scandate:Ce, or calcium aluminum silicon nitride:Ce. The composition of the third encapsulation material 814 may be the same as or different from the composition of the second encapsulation material 812. The weight ratio of fluorescent materials to resin may be lower than 20% and, preferably, lower than 10% in the third encapsulation material 814. The phosphor concentration in the third encapsulation material 814 may be lower than the phosphor concentration in the second encapsulation material 812 in an effort to counteract the higher intensity of region I 904 compared to region II 906, thereby reducing the color variation and emitting a more uniform white light.

For some embodiments, the third encapsulation material 814 may be optically transparent, containing substantially no fluorescent material. In such embodiments, the third encapsulation material 814 may simply comprise a resin, such as epoxy or silicone.

Figure 1:
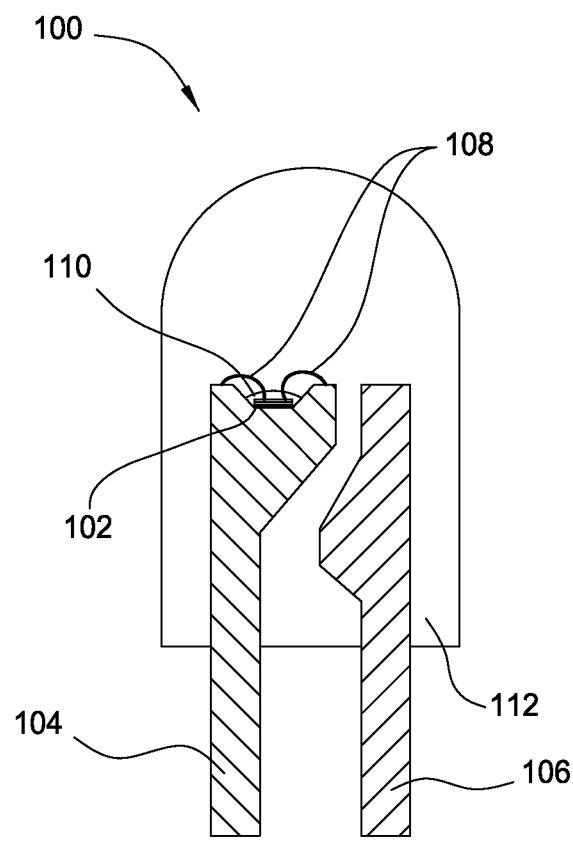
FIG. 1 is a prior art schematic sectional view of a lead-type white light-emitting diode (LED).
Figure 2:
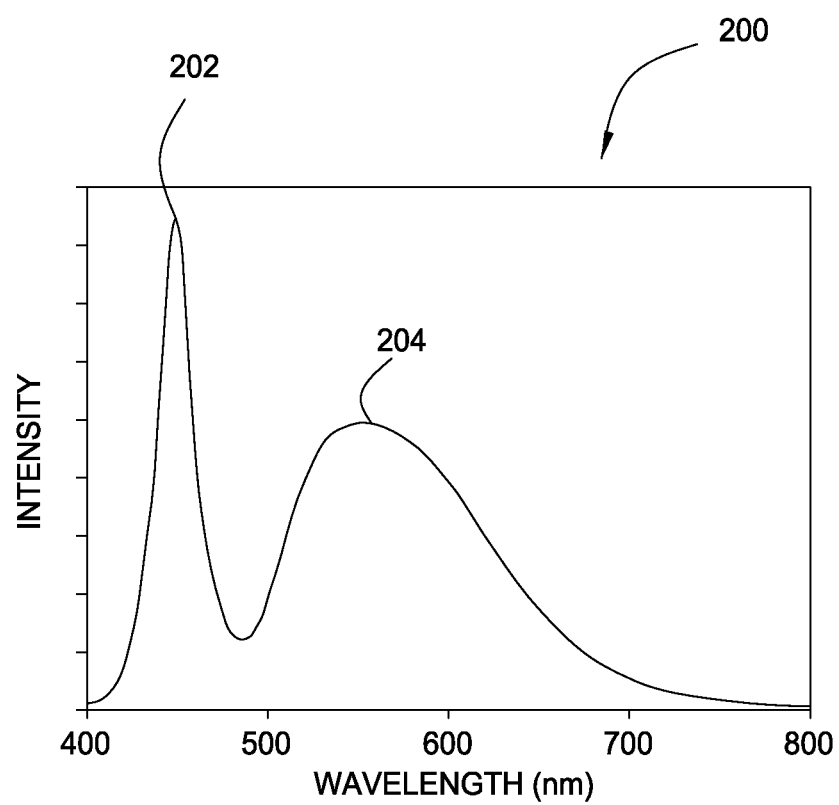
FIG. 2 illustrates a typical emission spectrum of white LEDs in accordance with the prior art.
Figure 3:
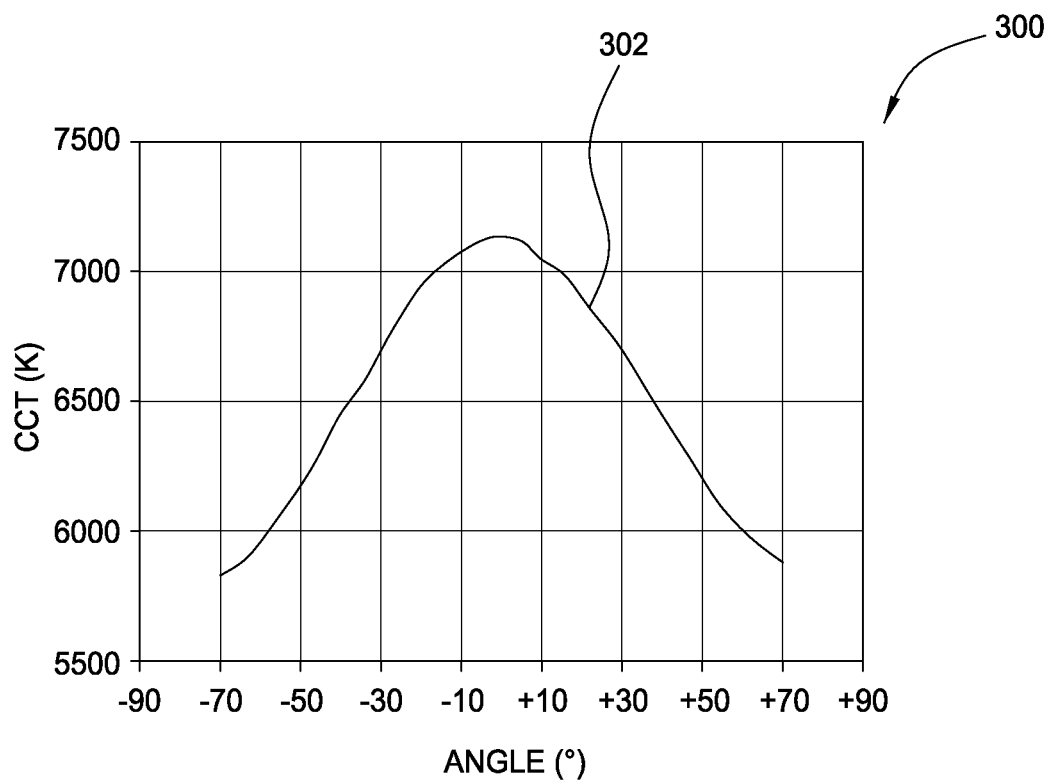
FIG. 3 illustrates a typical correlated color temperature (CCT) versus emission angle graph of white LEDs in accordance with the prior art.
Figure 4:
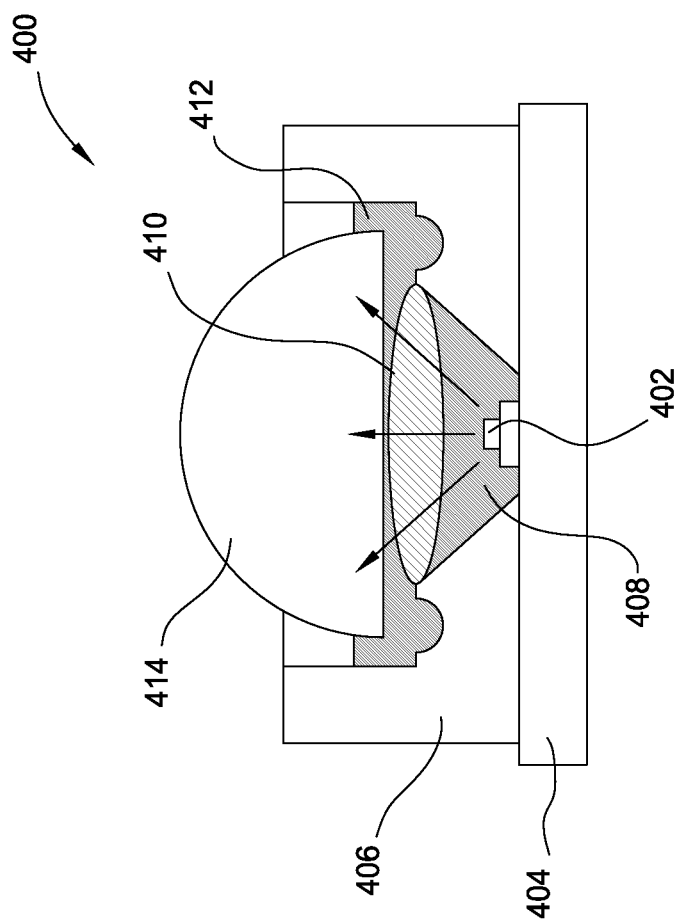
FIG. 4 is a prior art schematic sectional view of a surface-mount white LED encapsulated with multiple layers.
Figure 5:
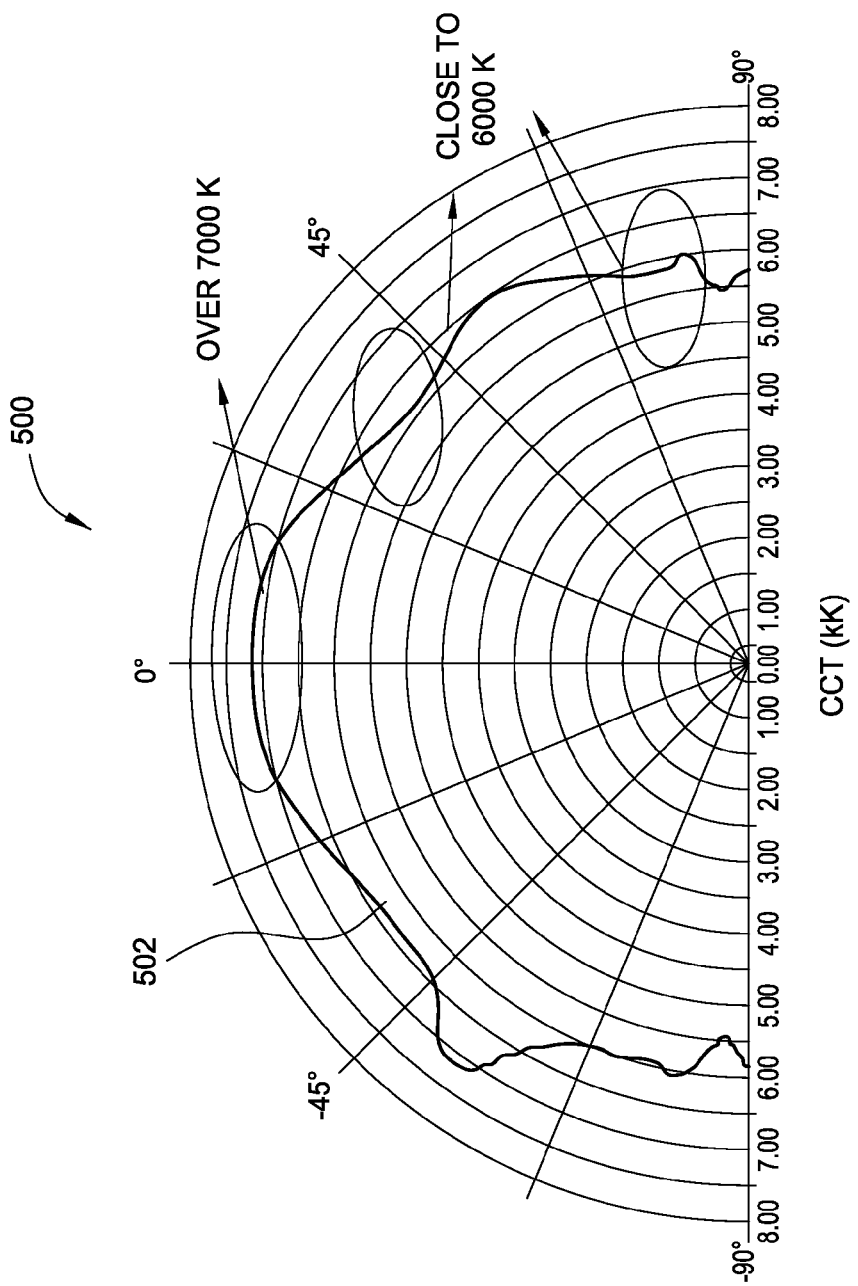
FIG. 5 illustrates a polar plot of CCT versus emission angle for the LED of FIG. 4.
Figure 11:
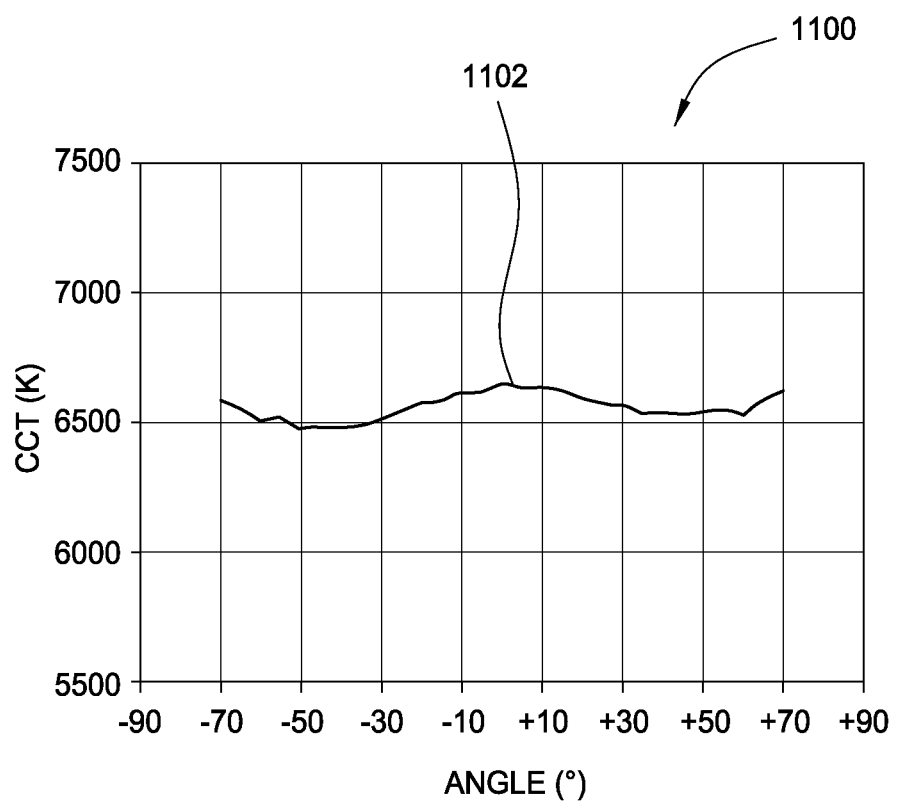
FIG. 11 illustrates a CCT versus emission angle graph of a white LED with multiple encapsulation layers according to an embodiment of the invention.
Figure 12:
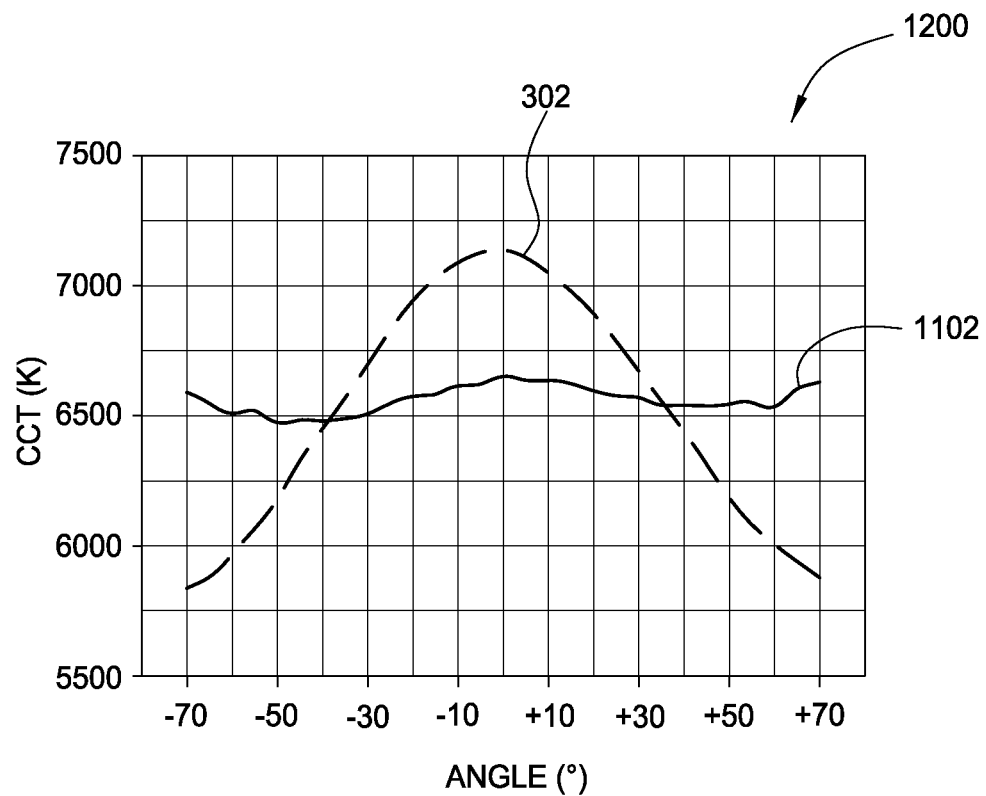
FIG. 12 illustrates a CCT versus emission angle graph comparing the prior art white LEDs to white LEDs with multiple encapsulation layers according to embodiments of the invention.

The reduced CCT variation for a typical light-emitting semiconductor device according to embodiments of the invention is illustrated in the graph 1100 of FIG. 11, where the correlated color temperature (CCT) in Kelvin is plotted against the emission angle in degrees from a center axis of the device. Over a 140° (±70° from the nominal axis) range of light emission angles, the CCT curve 1102 varies less than 200 K, producing a more uniform white light than conventional devices. In conventional devices, the CCT may be over 1000 K for the same range of emission angles, which can be seen in the graph 1200 of FIG. 12 where the typical conventional CCT curve 302 (described above with respect to FIG. 3) is compared to the CCT curve 1102 according to embodiments of the present invention.

An Exemplary Method of Fabricating a
Light-Emitting Device

Figure 13A:
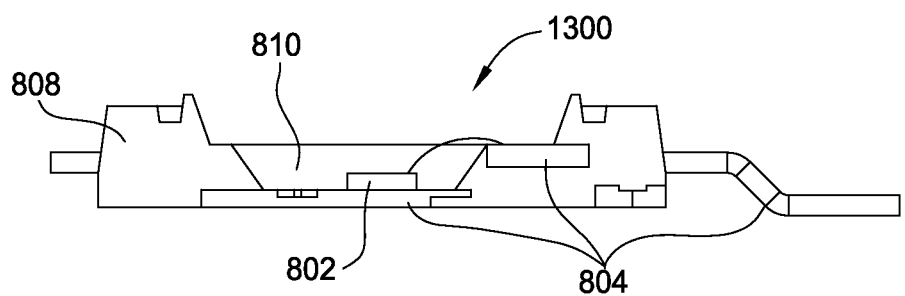
FIGS. 13A-C illustrate packaging a light-emitting semiconductor device with multiple encapsulation layers according to embodiments of the invention.

In order to construct a light-emitting semiconductor device having multiple encapsulation layers, one or more light-emitting semiconductor dies 802 may be disposed in a recessed volume of a housing 808. The dies 802 may be coupled to a lead frame 804 encased in the housing 808 by soldering and/or wire bonding, for example. Referring now to FIG. 13A, a first encapsulation material 810, such as liquid silicone gel or epoxy, may be dispensed into the recessed volume 1300. If a diffuser is desired, the diffuser may be combined and mixed with the resin before dispensing the first encapsulated material 810. The first encapsulation material 810 may be dispensed at a rate slow enough to prevent the formation of air bubbles in the material 810, which would adversely affect the optical performance of the light-emitting device 800. After the material 810 is sufficiently settled, the first encapsulation material 810 may be fully heat-cured to solidify it. For some embodiments, the first encapsulation material 810 may be only pre-cured at this stage such that only an upper layer is hardened. This may allow additional materials to be placed on the first encapsulation material 810 without settling into and mixing with the first encapsulation material 810 and without requiring the additional time for a full curing step, thereby speeding up the manufacturing process.

For some embodiments, the first encapsulation material 810 may be dispensed in more than one portion, where the first portion is allowed to settle before adding a second or any subsequent portions. For these embodiments, the individual portions may be cured or pre-cured before a subsequent portion is dispensed, or all of the portions of the first encapsulation material 810 may be cured or pre-cured after the final portion is dispensed.

Figure 13B:
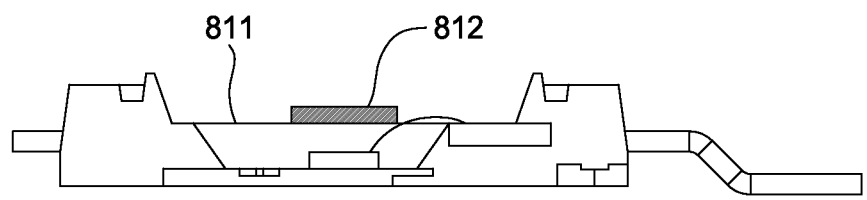

Once the first encapsulation material 810, or at least the upper surface thereof, has been sufficiently hardened to allow placing another material above the first encapsulation material 810 without mixing, the second encapsulation material 812 may be disposed above the first encapsulation material 810 as depicted in FIG. 13B. Covering only a portion of the upper surface 811 of the first encapsulation material 810, the second encapsulation material 812 may be formed by placing a pre-formed insert, such as a high concentration phosphor tape or molded plastic, on the upper surface 811. For other embodiments, the second encapsulation material 812 may be fabricated by stamping the second encapsulation material 812 onto the upper surface 811 with tooling. For still other embodiments, the second capsulation material 812 may be disposed on the upper surface 811 by inject printing. Such embodiments may create a second encapsulation material 812 with a flat upper surface.

Referring now to FIG. 14, the second encapsulation material 812 may be dispensed above the upper surface 811 of the first encapsulation materials for other embodiments. In such embodiments, the upper surface of the second encapsulation material 812 may be convex. The shape and dimensions of the second encapsulation material 812 may be controlled by the dispensing rate, the settling time before curing, and the curing time, for example. At this stage, the second encapsulation material 812 may be fully cured, which may include fully curing the first encapsulation material 810 if not fully cured before adding the second encapsulation material 812.

In any of the embodiments, the desired dimensions of the second encapsulation material 812 may depend on the angular displacement corresponding to region I 904 as described above and the height of the first encapsulation material 810. The pre-formed insert, the stamping, the inject printing, or the dispensing of the second encapsulation material 812 may be designed to cover only a portion of the upper surface 811 of the first encapsulation material 810 within region I 904. For example, the second encapsulation material 812 may only cover the upper surface of the first encapsulation material in about an 80° (±40° from a nominal axis) range of light emission angles for some embodiments.

Figure 13C:
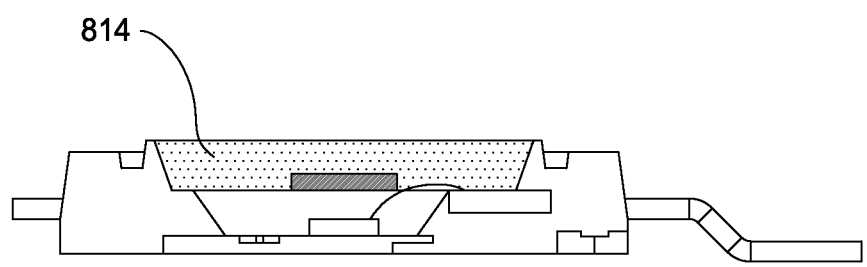
Figure 15:
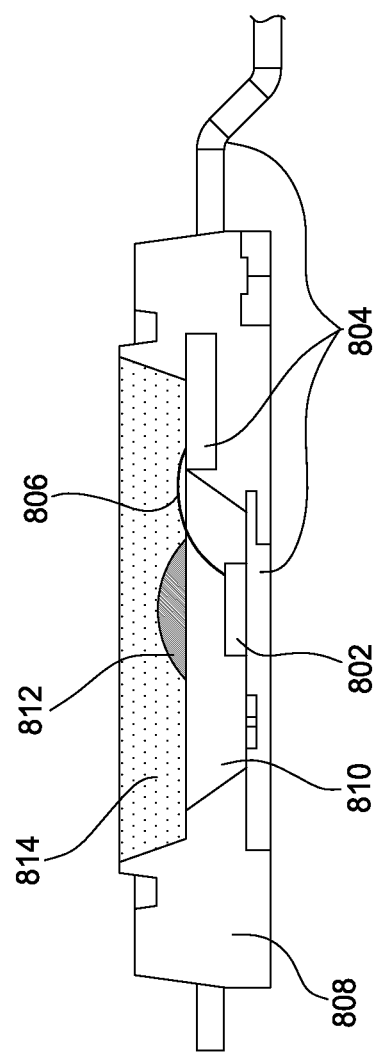
FIG. 15 illustrates packaging a light-emitting semiconductor device with multiple encapsulation layers according to an embodiment of the invention.

After the second encapsulation material 812 has been formed, the third encapsulation material 814 may be dispensed in the recessed volume 1300 to at least partially, if not completely, fill a remaining portion of the recessed volume 1300 as portrayed in FIG. 13C for a second encapsulation material 812 with a flat upper surface and in FIG. 15 for a second encapsulation material 812 with a convex upper surface. For some embodiments, the third encapsulation material 814 may be dispensed to cover the second encapsulation material 812 and the uncovered portions of the first encapsulation material 810. For other embodiments, the third encapsulation material 814 may be dispensed only to cover the uncovered portions of the first encapsulation material 810. As with the first encapsulation material 810, the third encapsulation material 814 may be dispensed in more than one portion, where the first portion is allowed to settle before adding a second or any subsequent portions. At this stage, the third encapsulation material 814 may be fully cured, which may include fully curing the first encapsulation material 810 if not fully cured before adding the second encapsulation material 812.

Another Exemplary Light-Emitting Device

Figure 16:
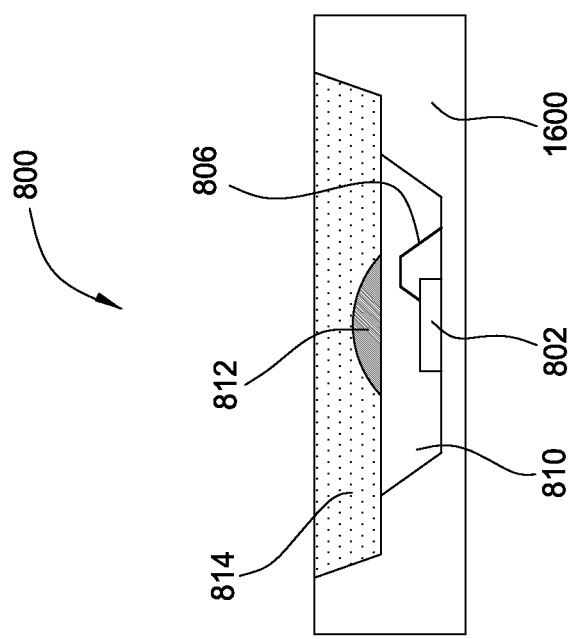
FIG. 16 is a schematic sectional view of a white light-emitting semiconductor device with multiple encapsulation layers where the die is disposed on a ceramic substrate according to an embodiment of the invention.

Referring now to FIG. 16, the one or more semiconductor dies 802 of a light-emitting semiconductor device 800 may be disposed on or within the recessed volume of a ceramic substrate 1600 and coupled to exposed traces or pads of the ceramic substrate 1600 via any suitable technique for electrical conductivity, such as soldering, bonding, or wiring with one or more bond wires 806. For some embodiments, the ceramic substrate 1600 may function as the housing 808, while in other embodiments another housing structure may be coupled to the ceramic substrate to provide the recessed volume. First, second, and third encapsulation materials 810, 812, 814 may be disposed in the recessed volume of the ceramic substrate 1600 as described above.

The ceramic substrate 1600 may comprise several layers of ceramic material with vias (not shown) connecting traces or pads on the upper layers to pads or other suitable structures for external connection on the lower layers. The traces may comprise copper, gold, or nickel-, gold-, or silver-plated copper. The sides of the recessed volume, or cavity, may be sloped, such that the cavity is shaped as an inverted cone or pyramid. For some embodiments, the sides of the cavity may be coated with a reflective material in an effort to enhance the light extraction from the device 800.

The one or more dies 802 may comprise any suitable semiconductor die capable of light emission, such as LED dies, VLED dies, or laser diode dies. For some embodiments, the p-doped side of a VLED die may be soldered to an electrically conductive pad or exposed trace on the ceramic substrate 1600, and the n-doped side may be coupled to another electrically conductive pad or exposed trace via a bond wire 806. For other embodiments, an LED die with a growth substrate (e.g., sapphire) may be bonded to the ceramic substrate 1600, and a p-electrode and an n-electrode may be coupled to separate electrically conductive pads or exposed traces on the ceramic substrate 1600 via bond wires 806. The bond wires 806 may be composed of gold (Au).

A lens (not shown) or cover plate may be utilized in any of the embodiments described or illustrated herein in an effort to focus or diffuse the emitted white light and protect the underlying elements. In such embodiments, the lens or cover plate may be coupled to the housing 808 or partially embedded in the third encapsulation material 814 before fully curing. For some embodiments, the lens or cover plate may be coated to further alter the optical properties of the emitted light, while for other embodiments, the lens or cover plate may be transparent.

While the foregoing is directed to embodiments of the present invention, other and further embodiments of the invention may be devised without departing from the basic scope thereof, and the scope thereof is determined by the claims that follow.

The invention claimed is:

1. A packaged light-emitting semiconductor device, comprising:
a housing having a recessed volume;
one or more light-emitting semiconductor dies disposed in the recessed volume;
a first encapsulation material disposed above the one or more light-emitting semiconductor dies;
a second encapsulation material disposed above the first encapsulation material such that only a portion of an upper surface of the first encapsulation material is covered by the second encapsulation material, wherein at least a portion of light emitted from the light-emitting semiconductor dies passes through the second encapsulation material; and
a third encapsulation material disposed above the first and second encapsulation materials and at least partially filling the recessed volume.

2. The device of claim 1, further comprising a lead frame for external connection coupled to the one or more dies.

3. The device of claim 1, wherein the housing comprises a ceramic substrate coupled to the one or more light-emitting semiconductor dies.

4. The device of claim 1, wherein the one or more light-emitting semiconductor dies are light-emitting diode (LED) dies, vertical light-emitting diode (VLED) dies, or laser diode dies.

5. The device of claim 1, wherein the first encapsulation material comprises a transparent resin.

6. The device of claim 1, wherein the first encapsulation material comprises a resin and a diffuser.

7. The device of claim 6, wherein the diffuser comprises at least one of $SiO_2$, $Al_2O_3$, $TiO_2$, or $Ta_2O_5$.

8. The device of claim 1, wherein the second encapsulation material comprises a resin and one or more fluorescent materials.

9. The device of claim 8, wherein the weight ratio of the fluorescent materials in the second encapsulation material is greater than 10%.

10. The device of claim 8, wherein the fluorescent materials comprise at least one of YAG/Gd:Ce, TAG:Ce, silicate:Eu, calcium scandate:Ce, calcium aluminum silicon nitride:Ce, or combinations thereof.

11. The device of claim 1, wherein the second encapsulation material comprises a pre-formed insert.

12. The device of claim 1, wherein an upper surface of the second encapsulation material is flat or convex.

13. The device of claim 1, wherein the second encapsulation material only covers the upper surface of the first encapsulation material in about an 80° (±40° from a nominal axis) range of light emission angles.

14. The device of claim 1, wherein the third encapsulation material comprises a resin and one or more fluorescent materials.

15. The device of claim 14, wherein the weight ratio of the fluorescent materials in the third encapsulation material is less than 20%.

16. The device of claim 14, wherein the fluorescent materials comprise at least one of YAG/Gd:Ce, TAG:Ce, silicate:Eu, calcium scandate:Ce, calcium aluminum silicon nitride:Ce, or combinations thereof.

17. The device of claim 1, wherein a phosphor concentration of the third encapsulation material is lower than a phosphor concentration of the second encapsulation material.

18. The device of claim 1, wherein a total correlated color temperature (CCT) variation is less than about 200 K over a 140° (±70° from a nominal axis) range of light emission angles.

19. The device of claim 1, further comprising a lens disposed at least partially above the third encapsulation material.

* * * * *